(12) United States Patent
Qu

(10) Patent No.: US 12,454,644 B2
(45) Date of Patent: Oct. 28, 2025

(54) DISPLAY DEVICE AND METHOD FOR PRODUCING DISPLAY DEVICE

(71) Applicant: SHARP KABUSHIKI KAISHA, Sakai (JP)

(72) Inventor: Yang Qu, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 478 days.

(21) Appl. No.: 17/928,805

(22) PCT Filed: Jun. 4, 2020

(86) PCT No.: PCT/JP2020/022123
§ 371 (c)(1),
(2) Date: Nov. 30, 2022

(87) PCT Pub. No.: WO2021/245880
PCT Pub. Date: Dec. 9, 2021

(65) Prior Publication Data
US 2023/0232661 A1    Jul. 20, 2023

(51) Int. Cl.
| | |
|---|---|
| *H10K 59/12* | (2023.01) |
| *C09K 11/06* | (2006.01) |
| *H10K 50/115* | (2023.01) |
| *H10K 50/15* | (2023.01) |
| *H10K 59/121* | (2023.01) |
| *H10K 59/131* | (2023.01) |

(52) U.S. Cl.
CPC ............ *C09K 11/06* (2013.01); *H10K 50/115* (2023.02); *H10K 50/156* (2023.02); *H10K 59/1213* (2023.02); *C09K 2211/10* (2013.01); *H10K 59/131* (2023.02)

(58) Field of Classification Search
CPC .. C09K 11/06; C09K 2211/10; H10K 50/115; H10K 50/156; H10K 59/1213; H10K 59/131; H05B 33/10; H05B 33/14
See application file for complete search history.

(56) References Cited

U.S. PATENT DOCUMENTS

| | | | | |
|---|---|---|---|---|
| 2016/0079558 A1* | 3/2016 | Moon | .................. | H10K 50/155 257/40 |
| 2017/0207407 A1* | 7/2017 | Liao | ....................... | H10K 50/11 |
| 2018/0108841 A1* | 4/2018 | Li | ......................... | H10K 71/162 |
| 2019/0348484 A1* | 11/2019 | Kang | .................. | H10K 85/111 |
| 2021/0098728 A1* | 4/2021 | Chung | ................ | H10K 50/115 |
| 2021/0371738 A1* | 12/2021 | Lee | ......................... | C09K 11/06 |
| 2023/0269956 A1* | 8/2023 | Zhang | .................... | H10K 85/50 257/40 |

FOREIGN PATENT DOCUMENTS

| | | |
|---|---|---|
| JP | 2012234748 A | 11/2012 |
| JP | 2019505946 A | 2/2019 |

* cited by examiner

*Primary Examiner* — S M Sohel Imtiaz
(74) *Attorney, Agent, or Firm* — ScienBiziP, P.C.

(57) ABSTRACT

A display device includes a light-emitting layer and a hole transport layer. The light-emitting layer includes quantum dots coordinated with a ligand including a thiol group. The hole transport layer includes VNPB that is chemically bonded to the thiol group.

7 Claims, 12 Drawing Sheets

LIGAND:

DISPLAY DEVICE AND METHOD FOR PRODUCING DISPLAY DEVICE

TECHNICAL FIELD

The disclosure relates to a display device including a plurality of pixels and a method for manufacturing the display device.

BACKGROUND ART

There is known a technique for forming an (organic) light-emitting layer of an organic electro-luminescence (EL) display element that is a self-luminous display element utilizing electroluminescence from an organic compound by using an application method such as ink-jet to form, for example, the light-emitting layer for each pixel of each of RGB luminescent colors (PTL 1).

CITATION LIST

Patent Literature

PTL 1: JP 2012-234748 A (published on Nov. 29, 2012)

SUMMARY

Technical Problem

However, in the above-described known display device and the manufacturing method thereof, for example, when photolithography is conjointly used to form pixels of each of RGB luminescent colors, the formation of a light-emitting layer is generally based on a photopolymerization reaction, and thus, due to excessive polymerization or a lack of polymerization, it is difficult to accurately pattern the light-emitting layer. As a result, in the known display device and the manufacturing method thereof, there may be a problem in that separate-patterning of the three RGB colors is not possible with high precision and the display quality, and thus, the display performance, deteriorates.

An aspect of the disclosure provides a display device having excellent display performance even when a light-emitting layer is patterned by using photolithography and a method for manufacturing the display device.

Solution to Problem

To address the above issues, a display device according to an aspect of the disclosure is provided with a display region including a plurality of pixels, the display device includes a thin film transistor layer and a light-emitting element layer formed with a plurality of light-emitting elements having different luminescent colors, each of the plurality of light-emitting elements including a first electrode, a function layer, and a second electrode, in which the function layer includes a light-emitting layer and a hole transport layer adjacent to the light-emitting layer, the light-emitting layer includes quantum dots coordinated with a ligand including a predetermined functional group, and the hole transport layer includes a hole transport material chemically bonded to the predetermined functional group.

To address the above issues, in a method for manufacturing a display device according to an aspect of the disclosure, the display device is provided with a display region including a plurality of pixels and a frame region surrounding the display region, the display device includes a thin film transistor layer and a light-emitting element layer formed with a plurality of light-emitting elements having different luminescent colors, each of the plurality of light-emitting elements including a first electrode, a function layer, and a second electrode, the method includes dripping, on an upper face of the first electrode, a first solution that forms a hole transport layer included in the function layer, the first solution including a predetermined first solvent and a hole transport material, dripping, on the first solution, a second solution that forms a light-emitting layer included in the function layer, the second solution including a predetermined second solvent and quantum dots coordinated with a ligand including a functional group chemically bonded to the hole transport material, exposing the second solution by irradiating the second solution, in a state where an exposure mask is placed above the second solution, with predetermined irradiation light from above the exposure mask, and patterning the light-emitting layer in a predetermined shape by using a predetermined developing solution.

Advantageous Effects of Disclosure

According to an aspect of the disclosure, a display device having excellent display performance even when a light-emitting layer is patterned by using photolithography and a method for manufacturing the display device can be provided.

DESCRIPTION OF EMBODIMENTS

First Embodiment

In the following, the term "same layer" refers to layers formed of the same material in the same process. In addition, the term "lower layer" refers to a layer formed in a process prior to that of a layer to be compared, and the term "upper layer" refers to a layer formed in a process after that of a layer to be compared. In the present specification, a direction from a lower layer to an upper layer of a display device is referred to as an upward direction.

Figure 1:
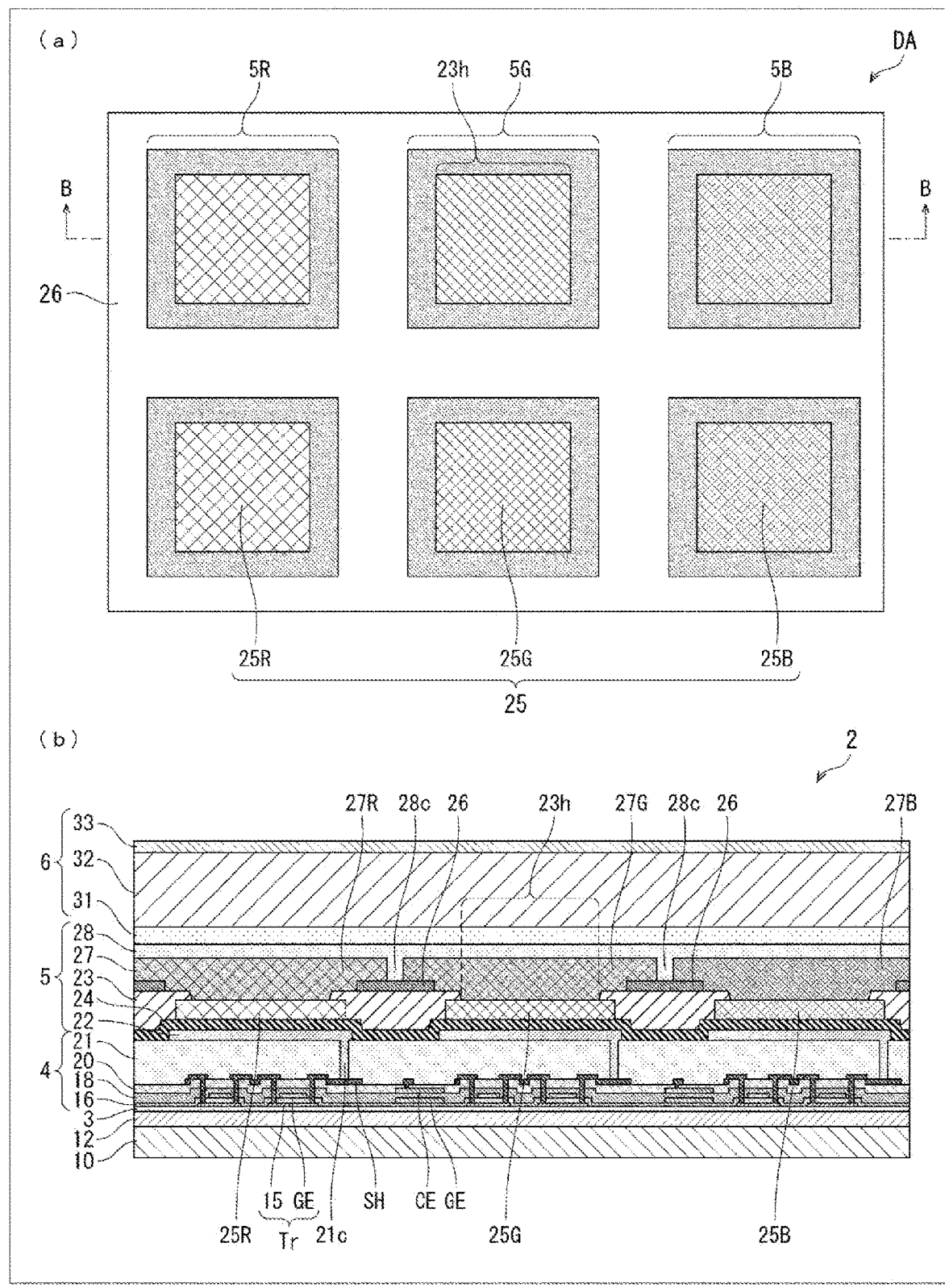
FIG. 1 includes an enlarged top view and a cross-sectional side view of a display region of a display device according to a first embodiment.
Figure 2:
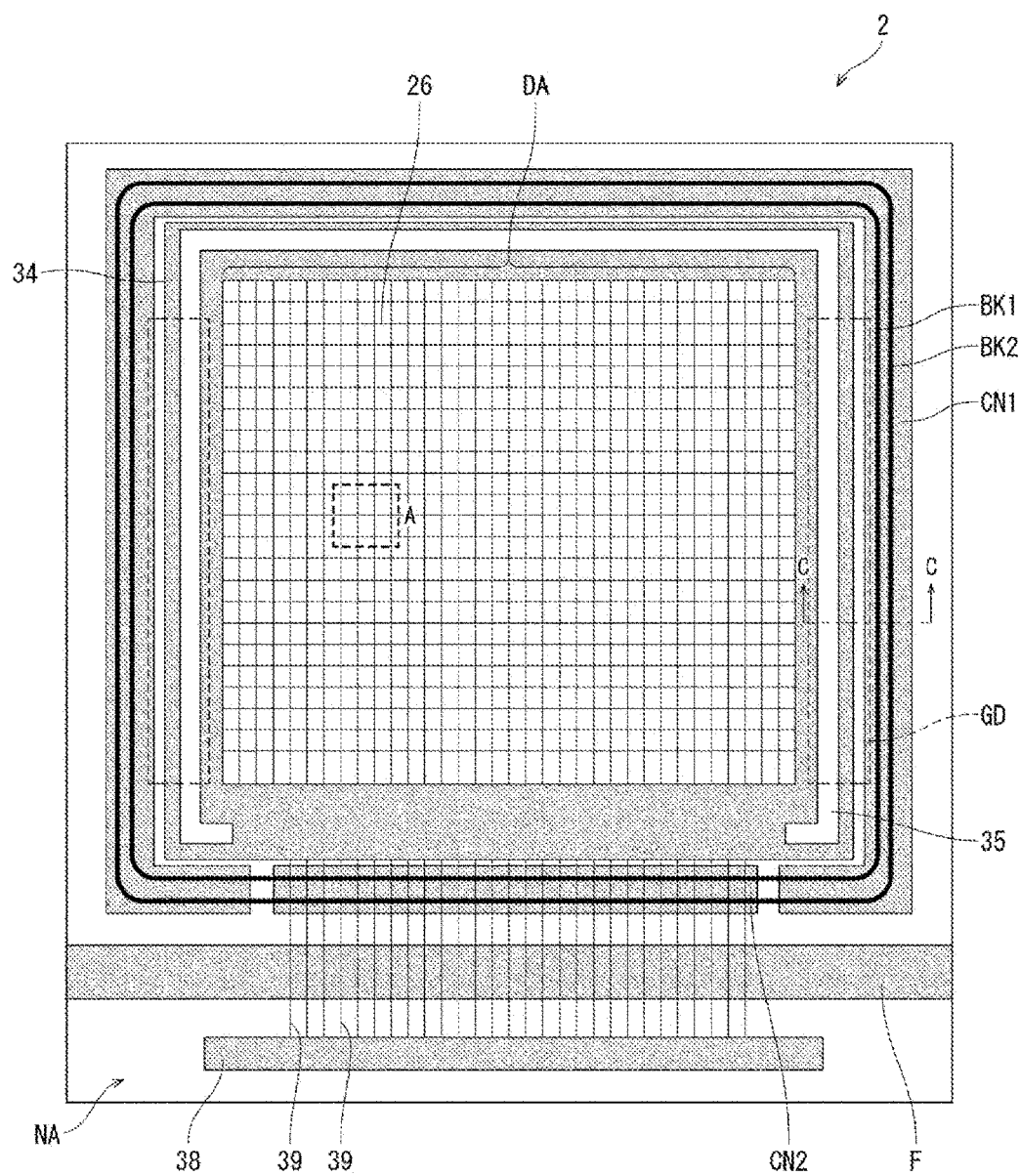
FIG. 2 is a top perspective view of the display device according to the first embodiment.
Figure 3:
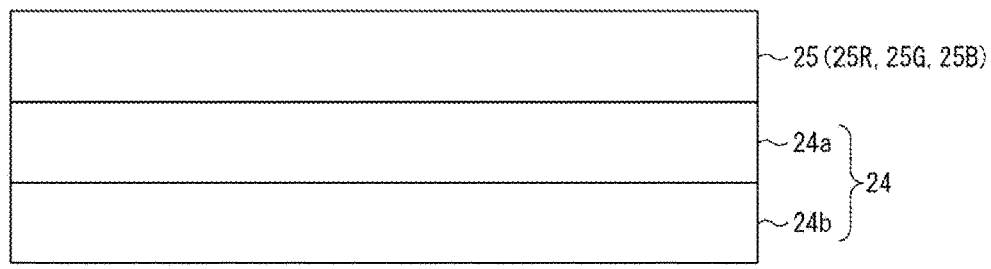
FIG. 3 is an enlarged cross-sectional view of main portions of the display device.
Figure 4:
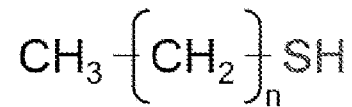
FIG. 4 is a diagram illustrating a configuration of a ligand coordinated to quantum dots of a light-emitting layer provided in the display device.
Figure 5:
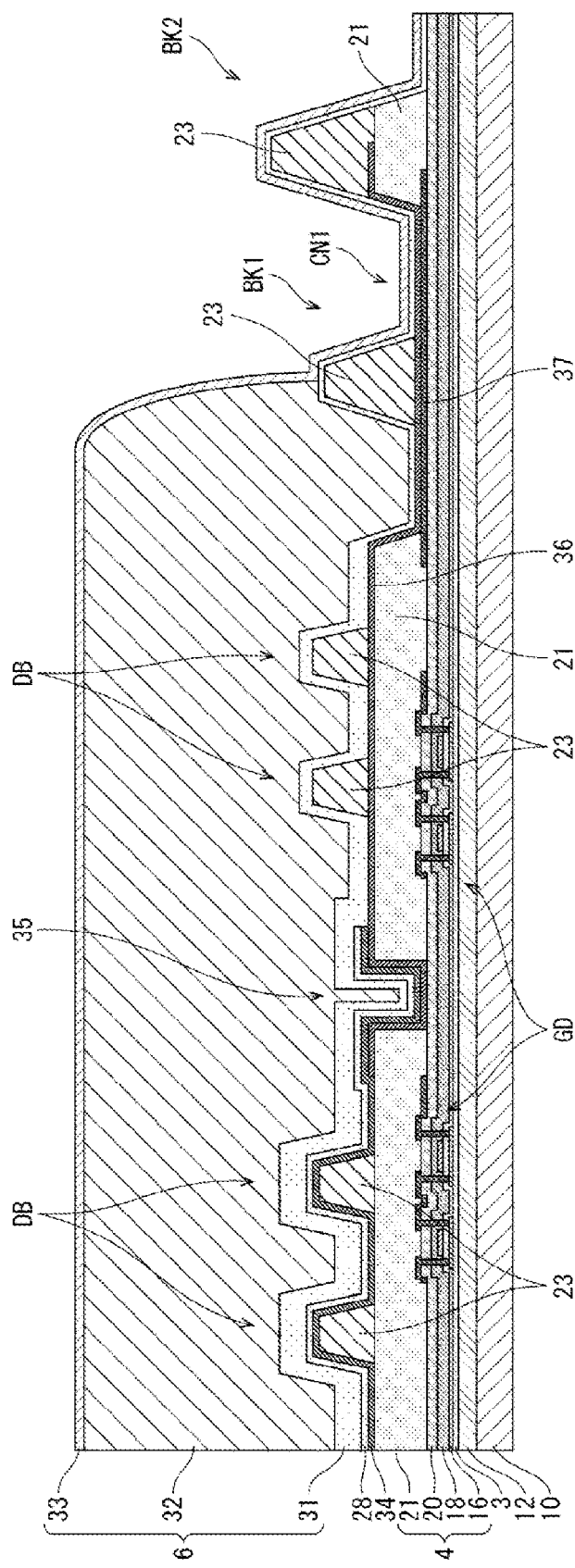
FIG. 5 is a cross-sectional side view of a frame region of the display device according to the first embodiment.

A display device 2 according to the present embodiment will be described with reference to FIGS. 1 to 5. FIG. 2 is a top view of the display device 2 according to the present embodiment. (a) of FIG. 1 is an enlarged top view of a region A in FIG. 2, and (b) of FIG. 1 is a cross-sectional view viewed in a direction of the arrows along line B-B in (a) of FIG. 1. FIG. 3 is an enlarged cross-sectional view of main portions of the display device 2. FIG. 4 is a diagram illustrating a configuration of a ligand coordinated to quantum dots of a light-emitting layer provided in the display device 2. FIG. 5 is a cross-sectional view viewed in a direction of the arrows along line C-C in FIG. 2.

As illustrated in FIG. 2, the display device 2 according to the present embodiment includes a display region DA and a frame region NA adjacent to a periphery of the display region DA. With reference to FIG. 1, a structure in the display region DA of the display device 2 according to the present embodiment will be described in more detail. Note that illustration of a hole transport layer 24, a second electrode 28, and a sealing layer 6, which will be described later in detail, is omitted in (a) of FIG. 1.

As illustrated in (b) of FIG. 1, the display device 2 according to the present embodiment includes a support substrate 10, a resin layer 12, a barrier layer 3, a thin film transistor layer 4, a light-emitting element layer 5, and the sealing layer 6 in this order from the lower layer. The display device 2 may include, in a further upper layer overlying the sealing layer 6, a function film or the like having an optical compensation function, a touch sensor function, a protection function, and the like.

The support substrate 10 may be, for example, a flexible substrate such as a PET film, or a rigid substrate such as a glass substrate. A material of the resin layer 12 may be polyimide, for example.

The barrier layer 3 is a layer for preventing foreign matter such as water and oxygen from penetrating into the thin film transistor layer 4 and the light-emitting element layer 5 during usage of the display device 2. For example, the barrier layer 3 may include a silicon oxide film, a silicon nitride film, or a silicon oxynitride film formed by CVD, or a layered film thereof.

The thin film transistor layer 4 includes a semiconductor layer 15, a first inorganic layer 16 (gate insulating film), a gate electrode GE, a second inorganic layer 18, a capacitance wiring line CE, a third inorganic layer 20, a source wiring line SH (metal wiring line layer), and a flattening film 21 (interlayer insulating film) in this order from the lower layer. A thin layer transistor Tr includes the semiconductor layer 15, the first inorganic layer 16, and the gate electrode GE.

The semiconductor layer 15 is composed of low-temperature polysilicon (LTPS) or an oxide semiconductor, for example. In (b) of FIG. 1, the thin film transistor provided with the semiconductor layer 15 as a channel is illustrated as having a top gate structure. However, the thin film transistor may have a bottom gate structure (for example, in a case where the channel of the thin film transistor is an oxide semiconductor).

The gate electrode GE, the capacitance electrode CE, or the source wiring line SH may include, for example, at least one of aluminum (Al), tungsten (W), molybdenum (Mo), tantalum (Ta), chromium (Cr), titanium (Ti), and copper (Cu). Furthermore, the gate electrode GE, the capacitance electrode CE, or the source wiring line SH is formed by a single-layer film or a layered film of any of the metals described above. Particularly, in the present embodiment, the gate electrode GE contains Mo, and the source wiring line SH contains Al.

The first inorganic layer 16, the second inorganic layer 18, and the third inorganic layer 20 may include a silicon oxide (SiOx) film or a silicon nitride (SiNx) film formed by CVD, or a layered film thereof, for example. The flattening film 21 may include a coatable photosensitive organic material such as polyimide or acryl. In the flattening film 21, a contact hole 21c is formed in a position overlapping the source wiring line SH of the thin layer transistor Tr.

The light-emitting element layer 5 (for example, an organic light-emitting diode layer) includes a first electrode 22 (anode electrode), the hole transport layer 24, a light-emitting layer 25, an edge cover 23 covering an edge of each light-emitting layer 25, an auxiliary wiring line 26, an electron transport layer 27, and the second electrode 28 (cathode electrode) in this order from the lower layer.

In the present embodiment, as illustrated in (a) of FIG. 1, the light-emitting element layer 5 includes, as a plurality of light-emitting elements, a red light-emitting element 5R including a red light-emitting layer 25R, a green light-emitting element 5G including a green light-emitting layer 25G, and a blue light-emitting element 5B including a blue light-emitting layer 25B. The light-emitting element layer 5 includes, for each of the plurality of light-emitting elements, the first electrode 22, the light-emitting layer 25, and the electron transport layer 27 in an island shape, and further includes the hole transport layer 24 common to the plurality of light-emitting elements, and the second electrode 28 in an island shape common to the plurality of light-emitting elements.

The display device 2 includes a plurality of pixels in the display region DA, and each of the pixels includes a red subpixel, a green subpixel, and a blue subpixel as subpixels being the smallest unit of display by the display device 2. The red subpixel includes the red light-emitting element 5R, the green subpixel includes the green light-emitting element 5G, and the blue subpixel includes the blue light-emitting element 5B.

In a plain view, the first electrode 22 is provided in a position overlapping the flattening film 21 and the contact hole 21c. The first electrode 22 is electrically connected to the source wiring line SH via the contact hole 21c. Thus, a signal in the thin film transistor layer 4 is supplied to the first electrode 22 via the source wiring line SH. Note that the thickness of the first electrode 22 may be 100 nm, for example. In the present embodiment, the first electrode 22 is formed by a layered structure including indium tin oxide (ITO) and an alloy containing Ag, for example, and has light reflectivity.

In the present embodiment, the hole transport layer 24 is formed to be common to the plurality of light-emitting elements in upper layers of the flattening film 21 and the first electrode 22. The hole transport layer 24 is an inorganic hole transport layer, and includes, for example, NiO or MgNiO as a hole transport material.

The light-emitting layer 25 is formed for each of the plurality of light-emitting elements in a position overlapping each of the first electrodes 22. In the present embodiment, the light-emitting layer 25 includes, for each of the plurality of light-emitting elements, the red light-emitting layer 25R, the green light-emitting layer 25G, and the blue light-emitting layer 25B described above.

In the present embodiment, the red light-emitting layer 25R, the green light-emitting layer 25G, and the blue light-emitting layer 25B respectively emit red light, green light, and blue light. That is, the red light-emitting element 5R, the green light-emitting element 5G, and the blue light-emitting element 5B are light-emitting elements that respectively emit red light, green light, and blue light.

Here, blue light refers to, for example, light having an emission center wavelength in a wavelength band of 400 nm or greater and 500 nm or less. The green light refers to, for example, light having an emission center wavelength in a wavelength band of greater than 500 nm and equal to or less than 600 nm. The red light refers to, for example, light having an emission center wavelength in a wavelength band of greater than 600 nm and equal to or less than 780 nm.

The light-emitting layer 25 (function layer) includes quantum dots coordinated with a ligand that includes a predetermined functional group. The hole transport layer 24 (function layer) includes a hole transport material that is chemically bonded to the functional group.

As illustrated in FIG. 3, the hole transport layer 24 preferably includes a first hole transport layer 24a including a first hole transport material that is chemically bonded to the functional group, and a second hole transport layer 24b that is adjacent to the first hole transport layer 24a on an opposite side from the light-emitting layer 25, does not include the first hole transport material, and includes a second hole transport material that is not chemically bonded to the functional group. Thus, the hole transport properties can be improved.

The first hole transport material and the second hole transport material may be the same material. Accordingly, an effect is obtained by which the number of materials can be reduced.

Note that, other than the configuration illustrated in FIG. 3, the hole transport layer 24 can also be formed only by the first hole transport layer 24a.

The functional group is provided at an end portion of the ligand. The functional group includes a thiol group. The hole transport material or the first hole transport material includes a double bond of two carbon atoms that is chemically bonded with the thiol group.

The ligand coordinated to the quantum dots is provided with a functional group at an end portion thereof, as illustrated in FIG. 4. The functional group includes a thiol group (n≥3). The functional group may be dodecanethiol (n=11).

The hole transport material or the first hole transport material may be N4,N4'-Di(naphthalen-1-yl)-N4,N4'-bis(4-vinylphenyl)biphenyl-4,4'-diamine (VNPB) or 9,9-Bis[4-[(4-ethenylphenyl)methoxy]phenyl]-N2,N7-di-1-naphthalenyl-N2,N7-diphenyl-9H-Fluorene-2,7-diamine (VB-FNPD).

One configuration example of the function layer excluding the first electrode 22 and the second electrode 28 includes PEDOT:PSS (hole injection layer)/Poly-TPD (second hole transport layer)/VNPB (first hole transport layer)/QD-DDT (light-emitting layer)/ZnO (electron transport and injection layer).

The edge cover 23 is an organic insulating film, and includes an organic material such as polyimide or acryl, for example. The edge cover 23 is formed in a position covering the edge of each of the light-emitting layers 25. The edge cover 23 includes an opening 23h for each of the plurality of light-emitting elements, and a part of each of the light-emitting layers 25 is exposed from the edge cover 23. Thus, the edge cover 23 divides each pixel of the display device 2 into a red subpixel, a green subpixel, and a blue subpixel.

In the present embodiment, the auxiliary wiring line 26 is formed in a position overlapping the edge cover 23. As illustrated in (a) of FIG. 1, the auxiliary wiring line 26 is provided in a lattice pattern. In the present embodiment, the auxiliary wiring line 26 contacts the edge cover 23 at the sealing layer 6 side. Note that, in the present embodiment, the auxiliary wiring line 26 is not limited to a shape in which a plurality of the linear auxiliary wiring lines 26 arranged at substantially equal intervals perpendicularly intersect each other, as illustrated in (a) of FIG. 1. For example, as in PenTile, an interval between adjacent ones of the auxiliary wiring lines 26 may vary depending on a position, and the auxiliary wiring lines 26 may intersect each other at an angle.

A material of the auxiliary wiring line 26 may be silver. Silver is a material generally used in a backplane of a display device, such as a metal layer of the thin film transistor layer 4. Silver included in the auxiliary wiring line 26 can be used as a material for forming the backplane upon formation of the auxiliary wiring line 26. In addition, the auxiliary wiring line 26 may include Al or Cu alone, have a layered structure of Ti/Al/Ti, or have a layered structure of W/Ta.

The electron transport layer 27 is formed for each of the plurality of light-emitting elements in a position overlapping each of the first electrodes 22. In the present embodiment, the electron transport layer 27 includes an electron transport layer 27R for the red light-emitting element 5R, an electron transport layer 27G for the green light-emitting element 5G, and an electron transport layer 27B for the blue light-emitting element 5B.

In the present embodiment, the electron transport layer 27 includes a photosensitive material as a binder, and oxide nanoparticles as an electron transport material. The photosensitive material included in the electron transport layer 27 contains a resin material and a photoinitiator. The resin material includes, for example, a polyimide resin, an acrylic resin, an epoxy resin, or a novolac resin. The photoinitiator includes, for example, a resin material, and a quinone diazide compound, a photoacid generator, or a photoradical generator.

The electron transport layer 27R is formed in a position overlapping the red light-emitting layer 25R. Thus, the red light-emitting element 5R includes the electron transport layer 27R as the electron transport layer 27. Similarly, the electron transport layer 27G is formed in a position overlapping the green light-emitting layer 25G, and the electron transport layer 27B is formed in a position overlapping the blue light-emitting layer 25B. Thus, the green light-emitting element 5G and the blue light-emitting element 5B respectively include the electron transport layer 27G and the electron transport layer 27B as the electron transport layer 27.

The second electrode 28 is formed as a common electrode common to the plurality of light-emitting elements in an upper layer of the electron transport layer 27. The second electrode 28 includes a metal nanowire, and has high light translucency. The metal nanowire included in the second electrode 28 may be, for example, a silver nanowire. In addition, the second electrode 28 may include an electrically conductive metal nanowire such as a gold nanowire, an aluminum nanowire, or a copper nanowire. Furthermore, the second electrode 28 includes, in a position overlapping the auxiliary wiring line 26 on the edge cover 23, a contact portion 28c formed in an opening formed in the electron transport layer 27. The second electrode 28 is electrically connected to the auxiliary wiring line 26 via the contact portion 28c. The second electrode 28 may be formed by vapor deposition.

In the present embodiment, a material of the second electrode 28 may be a mixed material including a silver nanowire dispersion. Further, the mixed material may include a binding agent, a dispersing agent, or other additives.

The sealing layer 6 includes a first inorganic sealing film 31 in an upper layer overlying the second electrode 28, an organic sealing film 32 in an upper layer overlying the first inorganic sealing film 31, and a second inorganic sealing film 33 in an upper layer overlying the organic sealing film 32, and prevents foreign matter such as water and oxygen from penetrating into the light-emitting element layer 5. The first inorganic sealing film 31 and the second inorganic sealing film 33 may be formed of, for example, a silicon oxide film, a silicon nitride film, or a silicon oxynitride film formed by CVD, or a layered film thereof. The organic sealing film 32 may be formed of a coatable photosensitive organic material such as a polyimide or an acrylic material.

Next, each configuration in the frame region NA in the periphery of the display region DA will be described with reference to FIG. 2 and FIG. 3. FIG. 3 is a cross-sectional view viewed in the direction of the arrows along line C-C in FIG. 2, and illustrates each member in the frame region NA adjacent to the periphery of the display region DA of the display device 2 according to the present embodiment.

As illustrated in FIG. 5, the display device 2 may also include, in the frame region NA, the support substrate 10, the resin layer 12, the barrier layer 3, the thin film transistor layer 4, and the sealing layer 6.

The display device 2 may include, in the frame region NA, a dummy bank DB formed by the edge cover 23 illustrated in FIG. 5. The dummy bank DB may be used as a spacer to abut against a CVD mask or the like in the formation of a common layer in the display region DA.

Furthermore, the display device 2 may include, in the frame region NA, a first bank BK1 formed by the edge cover 23, and a second bank BK2 formed by the flattening film 21 and the edge cover 23, as illustrated in FIG. 2 and FIG. 5. The first bank BK1 and the second bank BK2 are formed into a frame-like shape in the periphery of the display region DA. The first bank BK1 and the second bank BK2 regulate wet-spreading of the organic sealing film 32 due to coating the organic sealing film 32 with the sealing layer 6, which is an upper layer from the organic sealing film 32. For example, in FIG. 5, the first bank BK1 abuts against an end portion of the organic sealing film 32 to regulate wet-spreading of the organic sealing film 32.

As illustrated in FIG. 2 and FIG. 5, the display device 2 includes a stem wiring line 34 between the flattening film 21 and the second electrode 28 in the frame region NA. The stem wiring line 34 is in the same layer as the auxiliary wiring line 26, and is formed of the same material as the auxiliary wiring line 26. As illustrated in FIG. 2, the auxiliary wiring line 26 branches from the stem wiring line 34, and extends from the frame region NA to the display region DA. As described above, the auxiliary wiring line 26 that branches from the stem wiring line 34 is formed in a lattice pattern in a position overlapping the edge cover 23 described above in the display region DA.

As illustrated in FIG. 2 and FIG. 5, a slit 35 being an opening of the flattening film 21 may be formed in the frame region NA in a position surrounding a part of the periphery of the display region DA. By forming the thin film transistor of the thin film transistor layer 4 on the display region DA side of the slit 35 and a peripheral side of the display device 2, a gate driver monolithic GD illustrated in FIG. 2 and FIG. 5 may be formed. Note that the slit 35 may not be necessarily formed.

Here, as illustrated in FIG. 5, the stem wiring line 34, together with the second electrode 28, extends farther to the peripheral side of the display device 2 than the slit 35, which includes the inside of the slit 35. As illustrated in FIG. 2, a conductive film 36 that is of the same material as that of the first electrode 22 and that is in the same layer as the first electrode 22 is formed in the frame region NA. In the frame region NA, the conductive film 36 extends from a side closer to the display region DA than the slit 35, passes through the inside of the slit 35, and extends farther to the peripheral side of the display device 2 than the slit 35. Thus, the stem wiring line 34 and the conductive film 36 are electrically connected to each other in a position including the inside of the slit 35.

The conductive film 36 further extends to a position overlapping the first bank BK1 and the second bank BK2. A source conductive film 37 that includes the same material as the source wiring line SH of the thin film transistor layer 4 and is in the same layer as the source wiring line SH is formed in a position overlapping the first bank BK1 and the second bank BK2. Thus, the conductive film 36 and the source conductive film 37 are connected to each other in a first connection portion CN1 in a position including a portion between the first bank BK1 and the second bank BK2.

As illustrated in FIG. 2, the display device 2 includes a terminal portion 38 in the frame region NA. The terminal portion 38 is formed in the periphery of the second bank BK2. A driver (not illustrated) that supplies a signal for driving each of the light-emitting elements in the display region DA via a lead wiring line 39, and the like are mounted on the terminal portion 38. The slit 35 may not be formed in a position where the lead wiring line 39 is formed in the periphery of the four sides of the display region DA.

Note that the source conductive film 37 is also formed in a position overlapping the lead wiring line 39 and overlapping the first bank BK1 and the second bank BK2. Thus, the lead wiring line 39 and the source conductive film 37 are connected to each other in a second connection portion CN2 in a position overlapping the lead wiring line 39 and including a portion between the first bank BK1 and the second bank BK2.

The source conductive film 37 in the first connection portion CN1 and the source conductive film 37 in the second connection portion CN2 are electrically conductive. Therefore, an electrical connection between a high-voltage power supply and the stem wiring line 34, and thus an electrical connection between the high-voltage power supply and the auxiliary wiring line 26 are established via the lead wiring line 39, the source conductive film 37, and the conductive film 36. Thus, the auxiliary wiring line 26 is electrically connected to both of the high-voltage power supply and the second electrode 28, and achieves an effect of reducing a voltage drop in the second electrode 28 in a position away from the high-voltage power supply.

Note that, when the support substrate 10 is a flexible substrate, as illustrated in FIG. 2, the display device 2 may include a bending portion F formed along an outer periphery of the display device 2 between the second bank BK2 and the terminal portion 38. In the display device 2 in practical use, the peripheral side of the display device 2 from the bending portion F including the terminal portion 38 may be bent by the bending portion F to fold back to a back face side of the display device 2.

Figure 6:
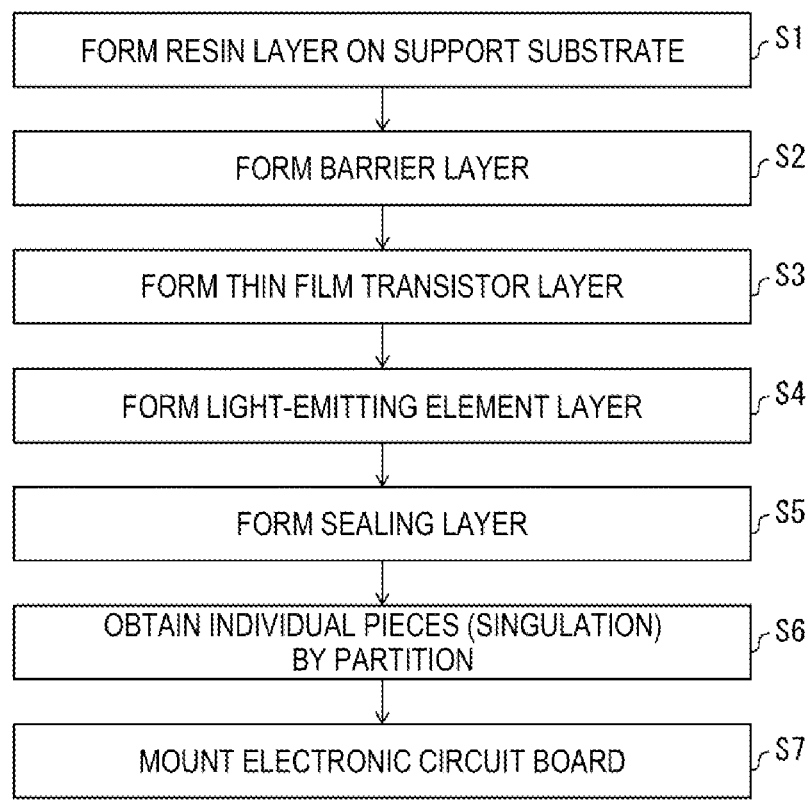
FIG. 6 is a flowchart illustrating a method for manufacturing the display device according to the first embodiment.

Next, a method for manufacturing the display device 2 according to the present embodiment will be described in detail with reference to FIG. 6. FIG. 6 is a flowchart illustrating steps in the manufacturing process of the display device 2 according to the present embodiment.

First, the resin layer 12 is formed on a transparent support substrate (for example, a mother glass substrate) (step S1). Next, the barrier layer 3 is formed in an upper layer overlying the resin layer 12 (step S2). Subsequently, the thin film transistor layer 4 is formed in an upper layer overlying the barrier layer 3 (step S3). When forming each of the layers from step S1 to step S3, a known film formation method of the related art may be employed.

Note that, in step S3, formation of the source conductive film 37 may be performed together with formation of the source wiring line SH. Further, formation of the slit 35 and formation of a part of the second bank may be performed together with formation of the flattening film 21. Furthermore, a transistor included in the gate driver monolithic GD may be formed together with formation of the thin film transistor Tr in the thin film transistor layer 4.

Figure 7:
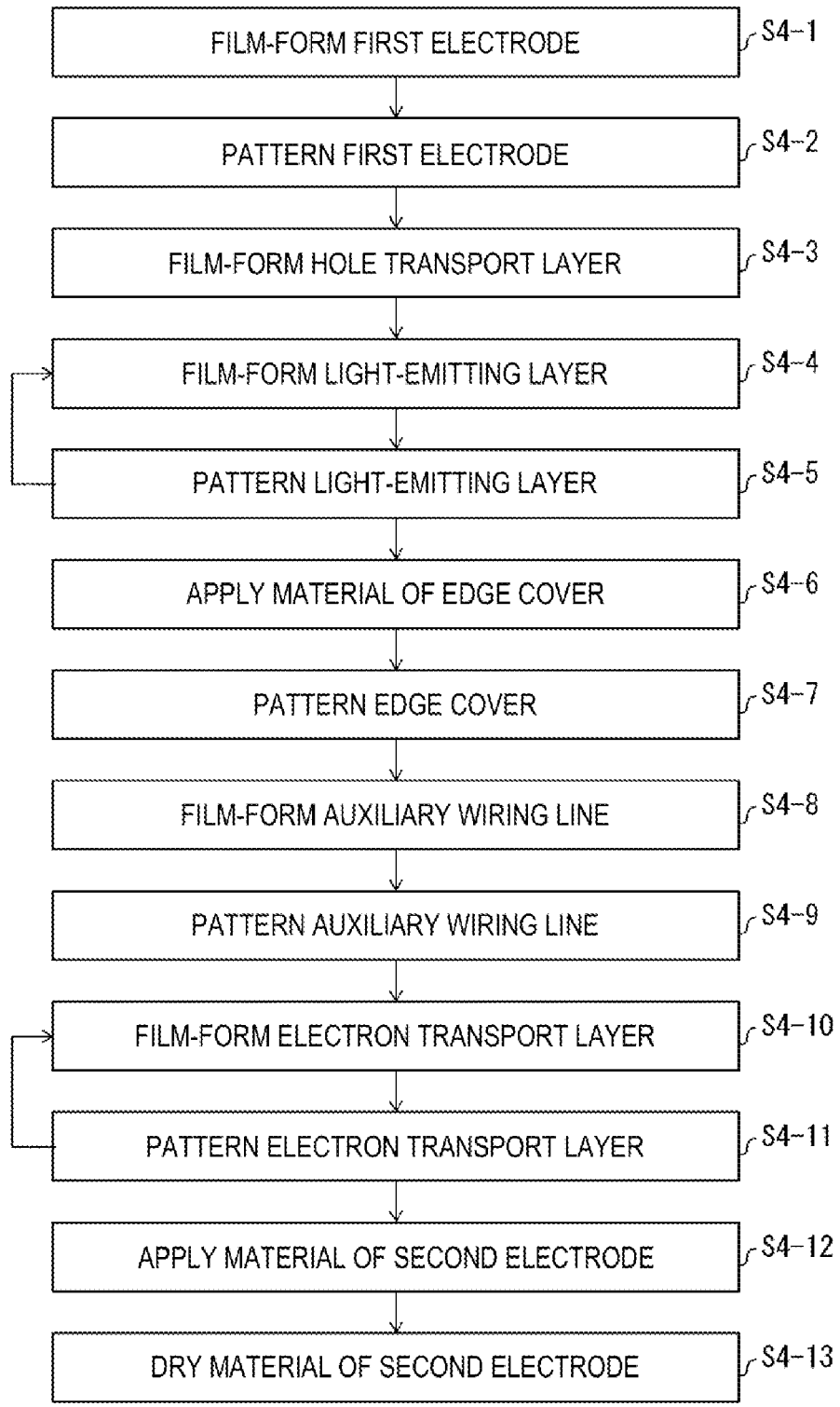
FIG. 7 is a flowchart illustrating in more detail a formation of a light-emitting element layer in the method for manufacturing the display device according to the first embodiment.
Figure 8:
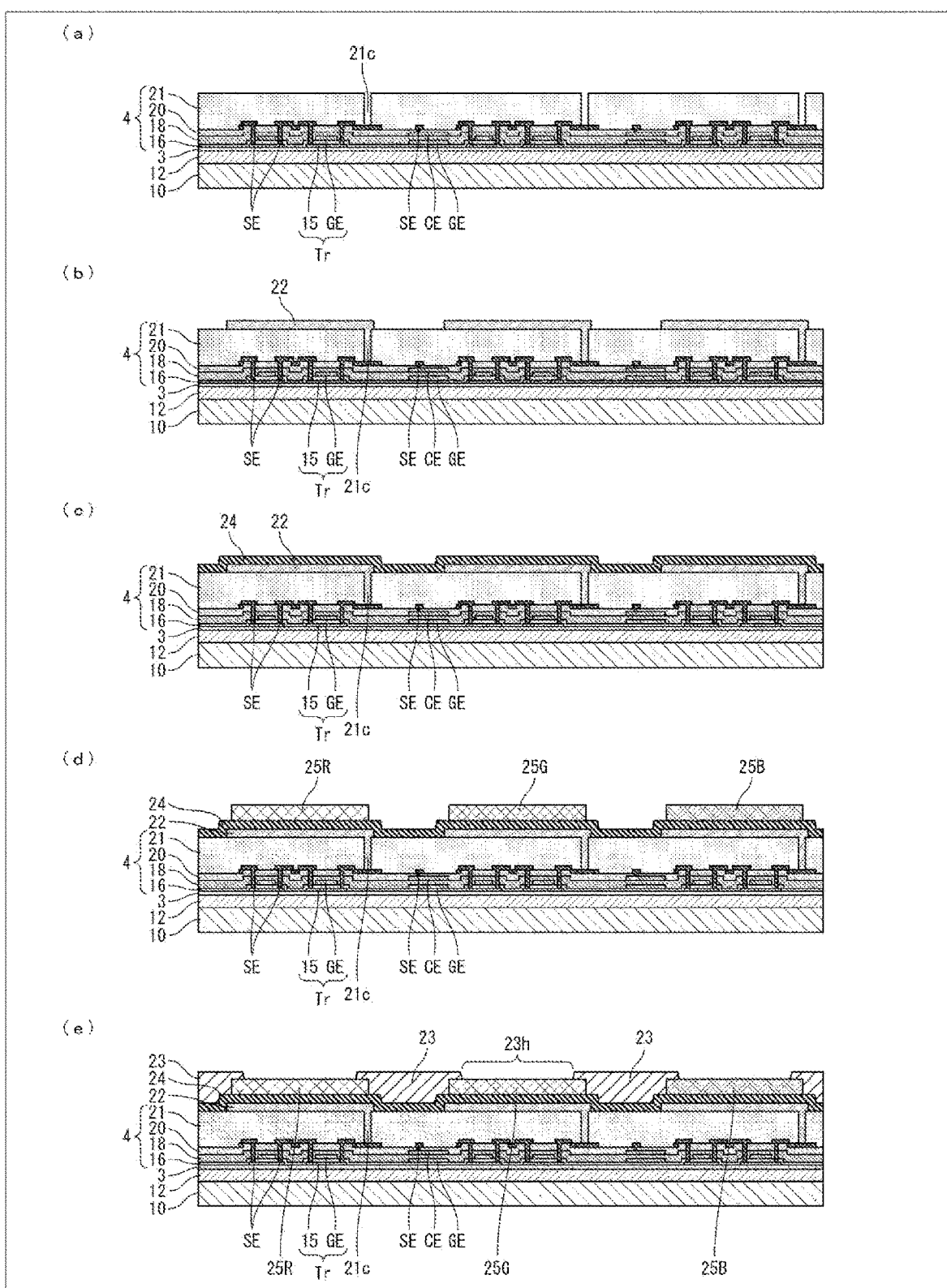
FIG. 8 includes process cross-sectional views for describing the method for manufacturing the display device according to the first embodiment.
Figure 9:
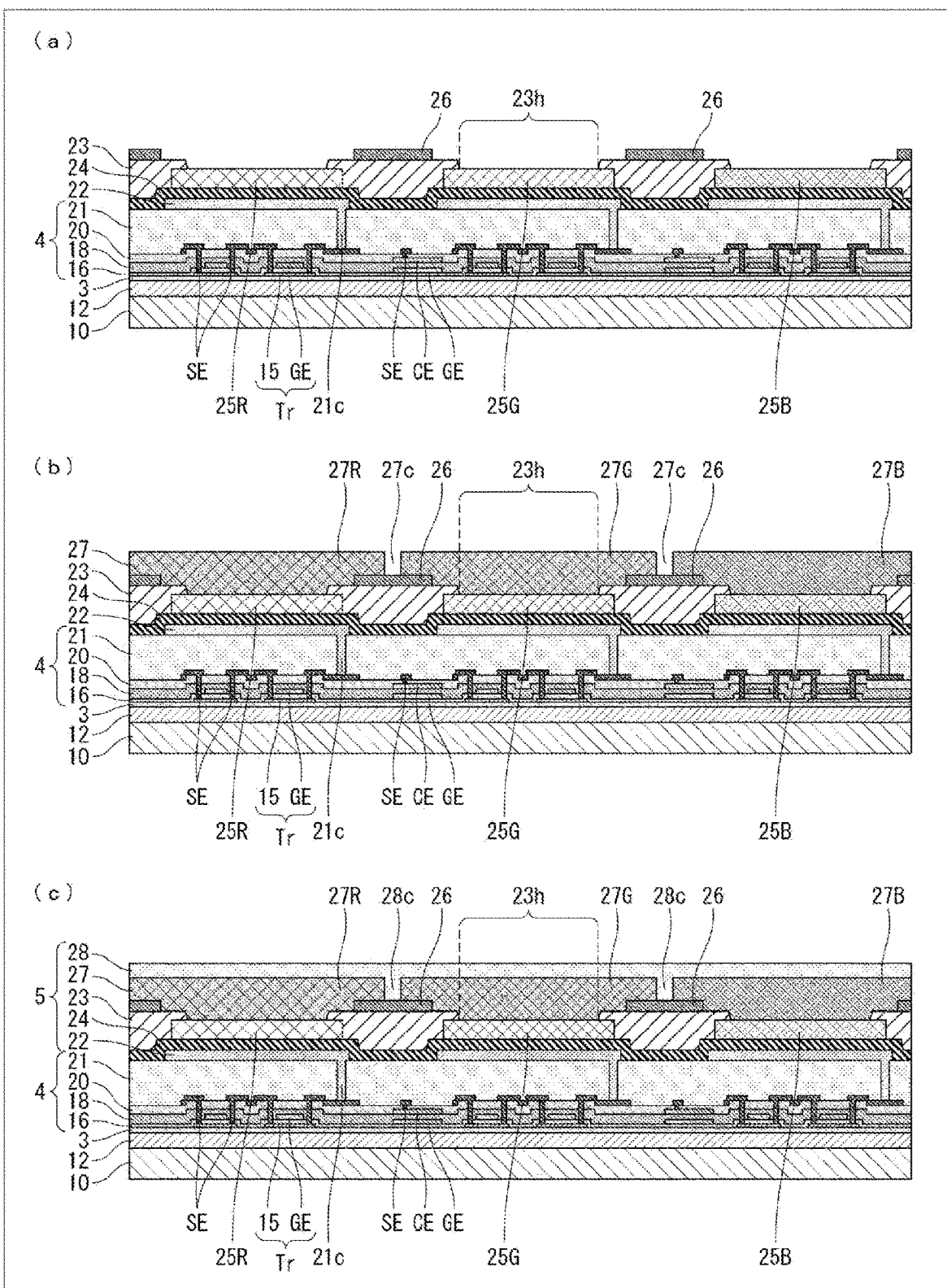
FIG. 9 includes other process cross-sectional views for describing the method for manufacturing the display device according to the first embodiment.

Next, the light-emitting element layer 5 is formed in an upper layer overlying the thin film transistor layer 4 (step S4). A method of forming each of the layers in step S4 will be described in more detail with reference to FIGS. 7 to 9. FIG. 7 is a flowchart illustrating a process of forming the light-emitting element layer 5 in the present embodiment. FIG. 8 and FIG. 9 are process cross-sectional views for describing in more detail the process of forming the light-emitting element layer 5, which is implemented based on the flowchart in FIG. 7. Note that, all subsequent process cross-sectional views including FIG. 8 and FIG. 9 illustrate process cross-sectional views in a position corresponding to (b) of FIG. 1.

Execution of steps up to step S3 results in a structure illustrated in (a) of FIG. 8. In step S4, first, the first electrode 22 is film-formed (step S4-1). A sputtering method or the like can be employed for film-forming the first electrode 22. Note that, in step S4-1, film formation of the conductive film 36 is also performed.

Next, the first electrode 22 is patterned into individual electrodes (step S4-2). An etching method using photolithography or the like can be employed for patterning the first electrode 22. Execution of step S4-2 results in individual first electrodes 22 illustrated in (b) of FIG. 8. Note that, in step S4-2, patterning of the conductive film 36 is also performed.

Next, as illustrated in (c) of FIG. 8, the hole transport layer 24 is film-formed in an upper layer of the flattening film 21 and the first electrode 22 (step S4-3). In the film formation of the hole transport layer 24, a sputtering method, an application firing method using a solution coating device, such as ink-jet and various coaters, a low-temperature CVD method using a CVD mask, or the like can be used.

Next, the light-emitting layer 25 is formed. In the formation of the light-emitting layer 25, first, a light-emitting layer having any luminescent color in the light-emitting layer 25 is film-formed (step S4-4). For example, the red light-emitting layer 25R is film-formed by applying the material of the red light-emitting layer 25R to the upper layer of the hole transport layer 24.

Next, the film-formed red light-emitting layer 25R is patterned (step S4-5). Here, for example, a material in which quantum dots emitting red light are dispersed in a photosensitive material may be employed as the material of the red light-emitting layer 25R. Thus, the material of the applied red light-emitting layer 25R can be patterned by using photolithography.

Step S4-4 and step S4-5 described above are repeatedly executed according to a type of the light-emitting layer 25. Thus, each of the red light-emitting layer 25R, the green light-emitting layer 25G, and the blue light-emitting layer 25B illustrated in (d) of FIG. 8 is formed in a position overlapping a corresponding one of the first electrodes 22.

Note that, in the present embodiment, a method of patterning the light-emitting layer 25 by photolithography is given as an example, but no such limitation is intended. For example, the light-emitting layer 25 may be formed by direct separate patterning by an ink-jet method. In the present embodiment, an example is given in which the light-emitting layer 25 includes quantum dots, but no such limitation is intended. For example, the light-emitting layer 25 may include an organic EL material. In this case, the light-emitting layer 25 may be formed by vapor deposition of the organic EL material using a vapor deposition mask.

Next, a material of the edge cover 23 is applied to an upper layer of the hole transport layer 24 and the light-emitting layer 25 (step S4-6). A known technique of the related art for applying an organic material can be employed for applying a material of the edge cover 23. The material of the edge cover 23 is also applied to the frame region NA.

Next, the edge cover 23 is patterned (step S4-7). For example, a photosensitive resin may be added to the material of the edge cover 23 to pattern the edge cover 23 by using photolithography.

Thus, as illustrated in (e) of FIG. 8, the edge cover 23 is obtained. Note that, by patterning the edge cover 23, a part of each of the light-emitting layers 25 except for the end portion is exposed from the opening 23h of the edge cover 23. Note that, in step S4-7, the dummy bank DB and the first bank BK1 are formed. Furthermore, in step S4-7, a remaining part of the second bank BK2 is formed.

Next, the auxiliary wiring line 26 is film-formed in the upper layer of the light-emitting layer 25 and the edge cover 23 (step S4-8). A sputtering method or the like can also be used for film-forming the auxiliary wiring line 26. Note that, in step S4-8, the stem wiring line 34 is also film-formed.

Next, the auxiliary wiring line 26 is patterned (step S4-9). An etching method using photolithography or the like may be employed for patterning the auxiliary wiring line 26. Note that, the stem wiring line 34 is also patterned in step S4-9. Thus, as illustrated in (a) of FIG. 9, the auxiliary wiring line 26 in contact with an upper face of the edge cover 23 is formed in the upper layer of the edge cover 23.

Next, the electron transport layer 27 is formed. To form the electron transport layer 27, first, an electron transport layer corresponding to any subpixel in the electron transport layer 27 is film-formed (step S4-10). For example, the electron transport layer 27R is film-formed by applying a material of the electron transport layer 27R to a position including the upper layer of the red light-emitting layer 25R.

Next, the film-formed electron transport layer 27R is patterned (step S4-11). In the present embodiment, for example, a material in which oxide nanoparticles are dispersed in a photosensitive material is employed as the material of the electron transport layer 27R. Thus, the applied material of the electron transport layer 27R can be patterned by using photolithography. Note that TMAH or PGMEA may be employed as a developing solution used in the treatment of the electron transport layer 27 by photolithography.

Step S4-10 and step S4-11 described above are repeatedly executed according to a type of the electron transport layer 27. Thus, each of the electron transport layer 27R, the electron transport layer 27G, and the electron transport layer 27B illustrated in (b) of FIG. 9 is formed in a position overlapping the corresponding light-emitting layer 25. Here, in step S4-11, an opening is formed in the electron transport layer 27 at a position overlapping the auxiliary wiring line 26, to form a contact hole 27c illustrated in (b) of FIG. 9. Note that, also in the process of forming the electron transport layer 27, an ink-jet method or vapor deposition may be employed.

Next, the second electrode 28 is formed. To form the second electrode 28, first, ink including a metal nanowire is applied to the upper layer of the electron transport layer 27 (step S4-12). Next, the applied ink including the metal nanowire is dried (step S4-13) to form the second electrode 28 illustrated in (c) of FIG. 9. At this time, by also forming the second electrode 28 in a position overlapping the contact hole 27c formed in the electron transport layer 27, the contact portion 28c is formed, and an electrical connection is established between the auxiliary wiring line 26 and the second electrode 28. Thus, the process of forming the light-emitting element layer 5 is completed.

After step S4, the sealing layer 6 is formed (step S5). Next, a layered body including the support substrate 10, the resin layer 12, the barrier layer 3, the thin film transistor layer 4, the light-emitting element layer 5, and the sealing layer 6 is partitioned to obtain a plurality of individual pieces (step S6). Next, an electronic circuit board (for example, an IC chip) is mounted on the terminal portion 38 to form the display device 2 (step S7).

Note that, in the present embodiment, the transparent glass substrate described above may be used as the support substrate 10 as it is. However, by adding some steps, the flexible display device 2 can be manufactured.

For example, after step S5, a lower face of the resin layer 12 is irradiated with laser light through the transparent support substrate to reduce a bonding force between the support substrate and the resin layer 12, and the support substrate is peeled off from the resin layer 12. Next, a lower face film such as a PET film is attached to the lower face of the resin layer 12 to obtain the support substrate 10. After that, the processing proceeds to step S6, and thus, the flexible display device 2 is obtained. In this case, the terminal portion 38 side may be folded back from the bending portion F to the back face side of the support substrate 10 between step S6 and step S7.

Figure 10:
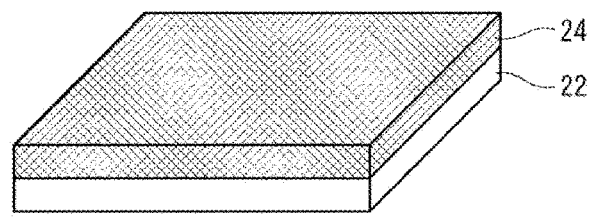
FIG. 10 is a perspective view for describing a first solution dripping process of the manufacturing method.
Figure 11:
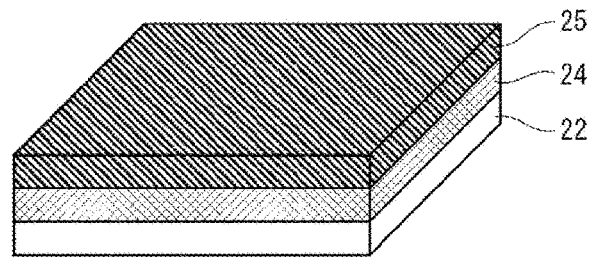
FIG. 11 is a perspective view for describing a second solution dripping process of the manufacturing method.
Figure 12:
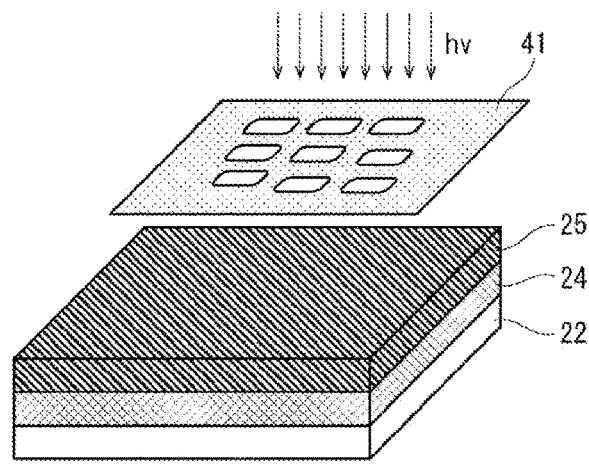
FIG. 12 is a perspective view for describing an exposure process of the manufacturing method.
Figure 13:
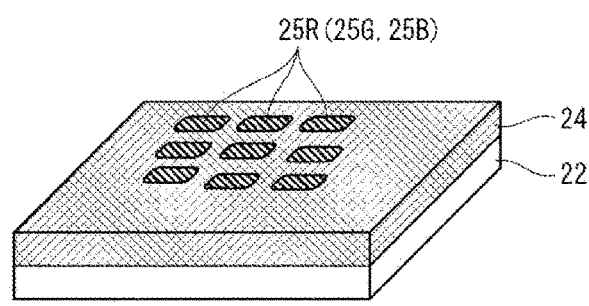
FIG. 13 is a perspective view for describing a patterning process of the manufacturing method.
Figure 14:
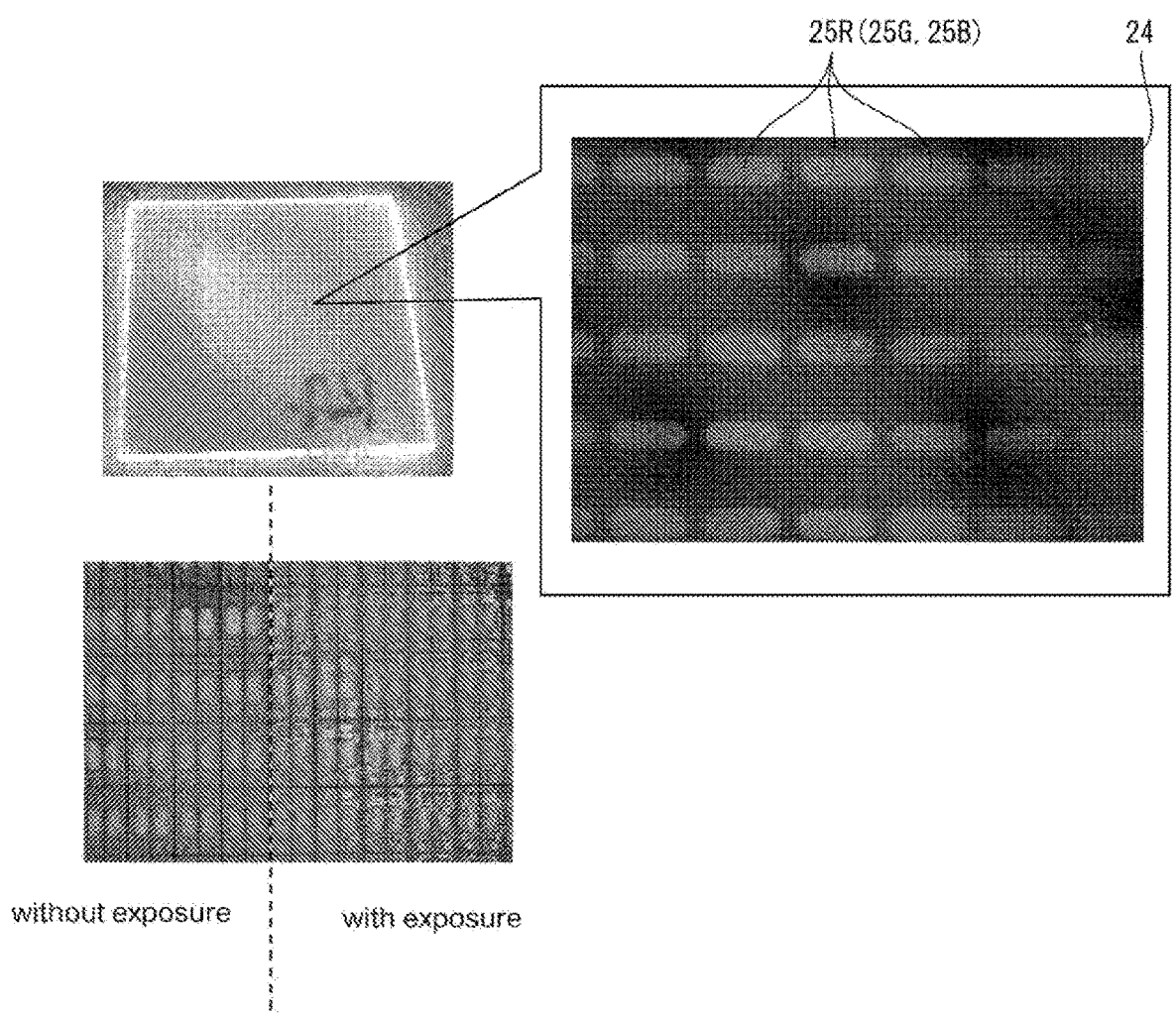
FIG. 14 is a diagram for describing a patterning process for patterning the light-emitting layer in a predetermined shape after the exposure process.

FIG. 10 is a perspective view for describing a first solution dripping process in the manufacturing method of the display device 2. FIG. 11 is a perspective view for describing a second solution dripping process in the manufacturing method. FIG. 12 is a perspective view for describing an exposure process in the manufacturing method. FIG. 13 is a perspective view for describing a patterning process in the manufacturing method. FIG. 14 is a diagram for describing a patterning process for patterning the light-emitting layer 25 in a predetermined shape after the exposure process.

The first solution dripping process illustrated in FIG. 10 corresponds to a process of film-forming the hole transport layer of FIG. 7 (step S4-3), and to FIG. 8(c). The second solution dripping process illustrated in FIG. 11 corresponds to a process of film-forming the light-emitting layer of FIG. 7 (step S4-4). The patterning process illustrated in FIG. 13 corresponds to a process of patterning the light-emitting layer of FIG. 7 (step S4-5), and to FIG. 8(d).

First, a first solution for forming the hole transport layer 24 included in the function layer is dripped on the upper face of the first electrode 22, the first solution including a predetermined first solvent and a hole transport material (first solution dripping process). For example, as illustrated in FIG. 10, a toluene solution of VNPB is applied on the first electrode 22 by spin coating.

Subsequently, a second solution for forming the light-emitting layer 25 included in the function layer is dripped on the first solution, the second solution including a predetermined second solvent and quantum dots coordinated with a ligand including a functional group chemically bonded to the hole transport material (second solution dripping process). For example, as illustrated in FIG. 11, a QD-DDT (an octane solution) is continuously applied on the toluene solution of the applied VNPB by a similar spin coating.

Next, as illustrated in FIG. 12, in a state where an exposure mask 41 is placed above the second solution, predetermined irradiation light is irradiated from above the exposure mask 41 (for example, exposure by ultraviolet (UV) for three minutes) to expose the second solution (exposure process). Subsequently, as illustrated in FIG. 13 and FIG. 14, for example, a predetermined developing solution such as toluene is used to pattern the light-emitting layer 25 into the red light-emitting layer 25R, the green light-emitting layer 25G, or the blue light-emitting layer 25B in a predetermined shape (patterning process). That is, a portion of the material not bonded in the chemical bonding described below is washed (removed) by the developing solution.

After the first solution dripping process, the second solution dripping process, the exposure process, and the patterning process are repeatedly performed sequentially for each luminescent color of red, green, and blue.

In the exposure process, the hole transport material and the functional group are chemically bonded by a cross-coupling reaction caused by irradiation with the irradiation light.

Figure 15:
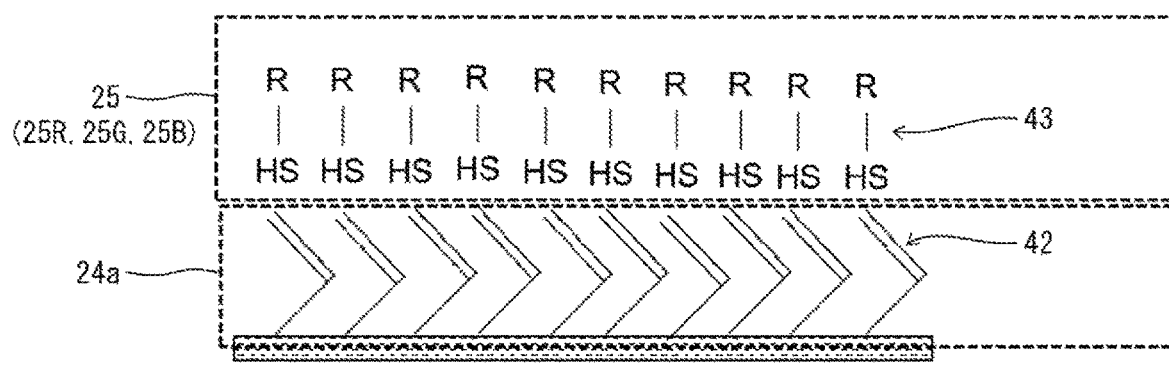
FIG. 15 is a schematic view for describing thiol groups of ligands coordinated to quantum dots included in the light-emitting layer of the display device and VNPB of a hole transport material of a hole transport layer.
Figure 16:
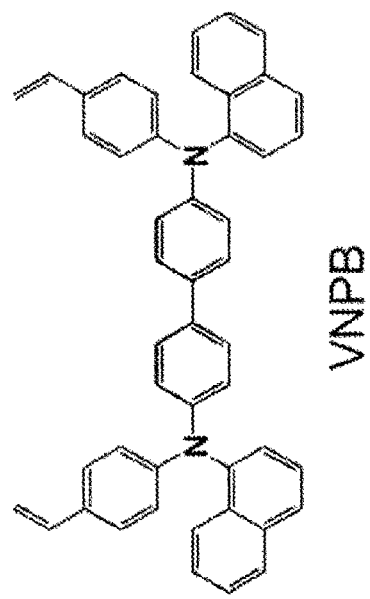
FIG. 16 is a diagram for describing chemical bonding of the thiol group and VNPB.
Figure 16:
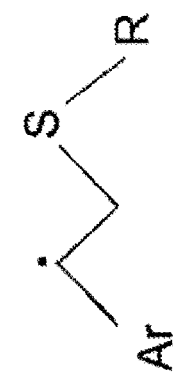

FIG. 15 is a schematic view for describing thiol groups of ligands coordinated to quantum dots included in the light-emitting layer 25 of the display device 2 and VNPB of a hole transport material of the first hole transport layer 24a. FIG. 16 is a diagram for describing chemical bonding of the thiol group and VNPB.

As illustrated in FIG. 15 and FIG. 16, VNPB 42 being a hole transport material included in the first hole transport layer 24a is chemically bonded, by the cross-coupling reaction described above, to thiol groups 43 of the ligands coordinated to the quantum dots included in the light-emitting layer 25.

Figure 17:
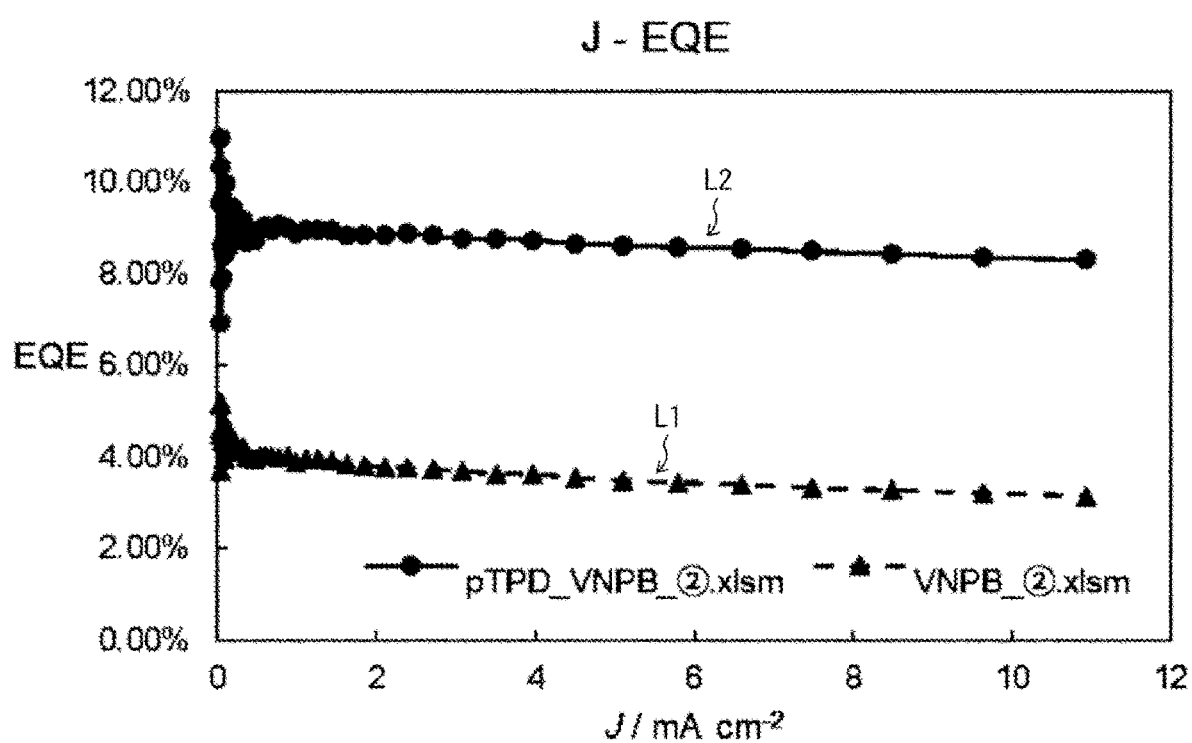
FIG. 17 is a graph showing the luminous efficiency of the light-emitting layer of the display device.

FIG. 17 is a graph showing the luminous efficiency of the light-emitting layer 25 of the display device 2. In FIG. 17, a line L1 indicates an external quantum efficiency (EQE) in a case where the hole transport layer 24 is composed only of VNPB. A line L2 indicates the EQE in a case where the hole transport layer 24 is formed by two layers including Poly-TPD/VNPB.

The EQE is improved in the line L2, compared to the line L1, which is considered to be a result of an improvement of the hole injection efficiency by the barrier mitigation of VBM of the Poly-TPD. The structure of other layers includes an anode (the first electrode 22) (ITO), a hole injection layer (HIL) (PEDOT:PSS), an EML (Cd-based QD-DDT), an ETL (the light-emitting layer 25) (ZnO), and a cathode (the second electrode 28) (Al). Thus, it is understood that the luminous efficiency of the display device can be improved by using the hole transport layer 24 including the first hole transport layer (VNPB) 24a and the second hole transport layer (Poly-TPD) 24b.

Thus, in the present embodiment, accurate patterning of the light-emitting layer is possible by using chemical bonding via a cross-coupling reaction. As a result, in the present embodiment, even when the light-emitting layer is patterned by using photolithography, differently from an example in the related art, no photopolymerization reaction is used, so that it is possible to simplify the control of the reaction progress in the patterning and prevent excessive reactions. Therefore, in the present embodiment, by the patterning the light-emitting layer, it is possible to easily perform separate-patterning in the three RGB colors with high precision. For example, even in forming a display device including light-emitting elements of the three RGB colors, it is possible to easily manufacture the display device at low cost, while preventing color mixing and improving the display performance.

Furthermore, if the hole transport layer 24 has a two-layer configuration including the first hole transport layer 24a (VNPB) and the second hole transport layer 24b (Poly-TPD), it is possible to improve the luminous efficiency of the display device.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device provided with a display region including a plurality of pixels, the display device comprising:
   a thin film transistor layer; and
   a light-emitting element layer comprising a plurality of light-emitting elements having different luminescent colors, each of the plurality of light-emitting elements including a first electrode, a function layer, and a second electrode,
   wherein the function layer includes a light-emitting layer and a hole transport layer adjacent to the light-emitting layer,
   the light-emitting layer includes quantum dots coordinated by a ligand including a predetermined functional group, and
   the hole transport layer includes:
      a first hole transport layer including a first hole transport material being chemically bonded to the predetermined functional group, and
      a second hole transport layer being adjacent to the first hole transport layer on an opposite side from the light-emitting layer, the second hole transport layer not including the first hole transport material and including a second hole transport material being not chemically bonded to the predetermined functional group.

2. The display device according to claim 1,
   wherein the first hole transport material and the second hole transport material are formed of an identical material.

3. The display device according to claim 1,
   wherein the predetermined functional group is provided at an end portion of the ligand.

4. A display device provided with a display region including a plurality of pixels, the display device comprising:
   a thin film transistor layer; and
   a light-emitting element layer comprising a plurality of light-emitting elements having different luminescent colors, each of the plurality of light-emitting elements including a first electrode, a function layer, and a second electrode,
   wherein the function layer includes a light-emitting layer and a hole transport layer adjacent to the light-emitting layer,
   the light-emitting layer includes quantum dots coordinated by a ligand including a predetermined functional group,
   the hole transport layer includes a hole transport material chemically bonded to the predetermined functional group, and
   the predetermined functional group includes a thiol group.

5. The display device according to claim 4,
   wherein the thiol group is dodecanethiol.

6. The display device according to claim 4,
   wherein the hole transport material includes a double bond of two carbon atoms being chemically bonded to the thiol group.

7. A display device provided with a display region including a plurality of pixels, the display device comprising:
   a thin film transistor layer; and
   a light-emitting element layer comprising a plurality of light-emitting elements having different luminescent colors, each of the plurality of light-emitting elements including a first electrode, a function layer, and a second electrode,
   wherein the function layer includes a light-emitting layer and a hole transport layer adjacent to the light-emitting layer,
   the light-emitting layer includes quantum dots coordinated by a ligand including a predetermined functional group,
   the hole transport layer includes a hole transport material chemically bonded to the predetermined functional group, and
   the hole transport material comprises N4,N4'-Di(naphthalen-1-yl)-N4,N4'-bis(4-vinylphenyl)biphenyl-4,4'-diamine (VNPB) or 9,9-Bis[4-[(4-ethenylphenyl)methoxy]phenyl]-N2,N7-di-1-naphthalenyl-N2,N7-diphenyl-9H-Fluorene-2,7-diamine (VB-FNPD).

\* \* \* \* \*